(12) United States Patent
Straeussnigg et al.

(10) Patent No.: US 12,712,509 B2
(45) Date of Patent: Aug. 18, 2026

(54) TRANSIENTS MINIMIZATION OF DIGITAL SYSTEMS DUE TO MEMORY UPDATE

(71) Applicant: Infineon Technologies AG, Neubiberg (DE)

(72) Inventors: Dietmar Straeussnigg, Villach (AT); Florian Brame, Villach (AT); David Andrew Russell, Bernareggio (IT)

(73) Assignee: Infineon Technologies AG, Neubiberg (DE)

( * ) Notice: Subject to any disclaimer, the term of this patent is extended or adjusted under 35 U.S.C. 154(b) by 198 days.

(21) Appl. No.: 18/422,366

(22) Filed: Jan. 25, 2024

(65) Prior Publication Data

US 2025/0247064 A1 Jul. 31, 2025

(51) Int. Cl.
*H03G 3/30* (2006.01)

(52) U.S. Cl.
CPC ......... *H03G 3/3026* (2013.01); *H03G 3/3089* (2013.01)

(58) Field of Classification Search
CPC ...... H03G 3/3026; H03G 3/3089; H04R 3/04; H04R 19/005; H04R 19/04; H04R 2410/00; H04R 2410/03
USPC ..................... 381/91, 92, 122, 113–115, 123
See application file for complete search history.

(56) References Cited

U.S. PATENT DOCUMENTS 5,677,962 A * 10/1997 Harrison ................ H03G 3/001 381/104
9,282,406 B2 3/2016 Bogason et al.
9,979,367 B2 * 5/2018 Rombach ............ H03G 3/3005
10,341,770 B2 7/2019 Baumgarte
10,461,714 B2 * 10/2019 Lesso .................. H03G 3/3089
10,797,715 B2 10/2020 Straeussnigg et al.
11,121,690 B2 9/2021 Lesso et al.
12,325,627 B2 6/2025 Straussnigg et al.
12,368,421 B2 7/2025 Ceballos et al.
12,439,204 B2 * 10/2025 Straussnigg .......... H03M 3/488
2009/0058531 A1 * 3/2009 Hwang ................ H03G 3/3068 330/278
2023/0344398 A1 10/2023 Ceballos et al.
2025/0094211 A1 3/2025 Spittle

* cited by examiner

*Primary Examiner* — Xu Mei
(74) *Attorney, Agent, or Firm* — Slater Matsil, LLP

(57) ABSTRACT

A filter includes a delay line; at least one gain component coupled to the delay line; and a summer coupled to the delay line, wherein the at least one gain component includes a first value during a normal mode of operation, and wherein the at least one gain component includes a second value during a transient mode of operation.

20 Claims, 12 Drawing Sheets

Gain change: g
gs=1 normal operation
gs=g Gain change
gs=1 normal operation

TRANSIENTS MINIMIZATION OF DIGITAL SYSTEMS DUE TO MEMORY UPDATE

RELATED APPLICATIONS

The present application is related to co-pending U.S. patent application Ser. No. 18/494,567 filed on Oct. 25, 2023 and entitled "FILTERING ARCHITECTURE WITH MINIMIZED TRANSIENTS," which is hereby incorporated by reference, and is related to co-pending U.S. patent application filed on the filing date of the present application (Jan. 25, 2024) and entitled "TRANSIENTS MINIMIZATION OF DIGITAL SYSTEMS DUE TO TEMPORARY SCALING," which is also hereby incorporated by reference.

TECHNICAL FIELD

The present invention relates generally to a filtering architecture with transients minimization due to a memory update of a gain value, and, in particular embodiments, to a corresponding filter, digital microphone, and method.

BACKGROUND

Digital microphones are known in the art. Customer requests for digital microphone features like dynamic acoustic overload point (AOP) switching or requirements for increased signal-to-noise ratio (SNR) and reduced power consumption from customer are also increasing. These specifications have led to the introduction of architectures shown in FIG. 1, which is described in further detail below. In the analog domain, the signal is lowered by a gain change in a programmable gain amplifier (PGA) to achieve a higher dynamic range, if a high level acoustic signal occurs. This gain change is compensated in the digital domain in order to achieve a linear signal without undesirable audible transient signals.

FIG. 1 is a block diagram of digital microphone 100 including a gain switching feature initiated by a "ctr" control signal 118. Digital microphone 100 includes a capacitive microelectromechanical system (MEMS) device 102 for providing an analog signal in response to ambient sound waves. MEMS devices 102 is coupled to an application-specific integrated circuit (ASIC) 104 including a PGA 106 for receiving the "ctr" control signal 118, an analog-to-digital converter (ADC) 108 coupled to PGA 106, and a digital low pass filter 110 coupled to ADC 108. ASIC 104 also includes a digital compensation block 112 coupled to the digital low pass filter 110 and for also receiving the "ctr" control signal 118, and a digital modulator 114 coupled to the digital compensation block 112 coupled to the digital low pass filter 110. The digital modulator 114 is configured for providing a one-bit digital output signal at digital output bus 120.

In some implementations of digital microphone 100, ADC 108 can comprise a sigma-delta ADC. The output signal of the sigma delta ADC (sigma-delta converter) is reconstructed in the digital domain (e.g. by low-pass filtering with minimized transients) as is depicted in FIG. 1. This "step" (due to gain change) generates a transient in the digital filter chain, which reduces the performance (e.g. audible artefacts). A technique for minimizing the audible transients is described in further detail in co-pending U.S. patent application Ser. No. 18/494,567, which was incorporated by reference above. Further such techniques are needed for keeping up with increasing customer requirements.

In some existing solutions, a tradeoff between performance (SNR/leveled noise, and total harmonic distortion (THD)) and transients is made. For instance, applying a stronger low-pass filter (that has a lower cut-off frequency) leads to better signal reconstruction but stronger transients.

SUMMARY

According to an embodiment, a filter comprises a delay line; at least one gain component coupled to the delay line; and a summer coupled to the delay line, wherein the at least one gain component comprises a first value during a normal mode of operation, and wherein the at least one gain component comprises a second value during a transient mode of operation.

According to another embodiment, a digital microphone comprises a programmable gain amplifier (PGA); an analog-to-digital converter (ADC) coupled to the PGA; a digital filter coupled to the ADC, wherein the digital filter comprises at least one gain component; and a digital gain compensation component coupled to the digital filter, wherein the at least one gain component comprises a first value during a normal mode of operation of the digital microphone, and wherein the at least one gain component comprises a second value during a transient mode of operation of the digital microphone.

According to another embodiment, a method of operating a digital microphone comprises setting at least one gain component of a filter of the digital microphone to a first gain value during a normal mode of operation of the digital microphone; and setting the at least one gain component of the filter of the digital microphone to a second gain value during a transient mode of operation of the digital microphone.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to an embodiment, audible transients are reduced or eliminated by storing the transients of the signal history in a memory of the filter. Gain values in the memory are updated during a transient mode of operation and are returned to nominal values during a normal mode of operation. The signal memory is stored in the delay lines of a digital filter (especially a digital FIR filter, in some embodiments). After the gain change from a nominal value of one to a gain value "g" all of the contents of the delay line are scaled by the gain change value "g" as well. This, in turn, results in the delay line already containing the values needed for steady state operation and therefore no or reduced audible transients occur.

Figure 1:
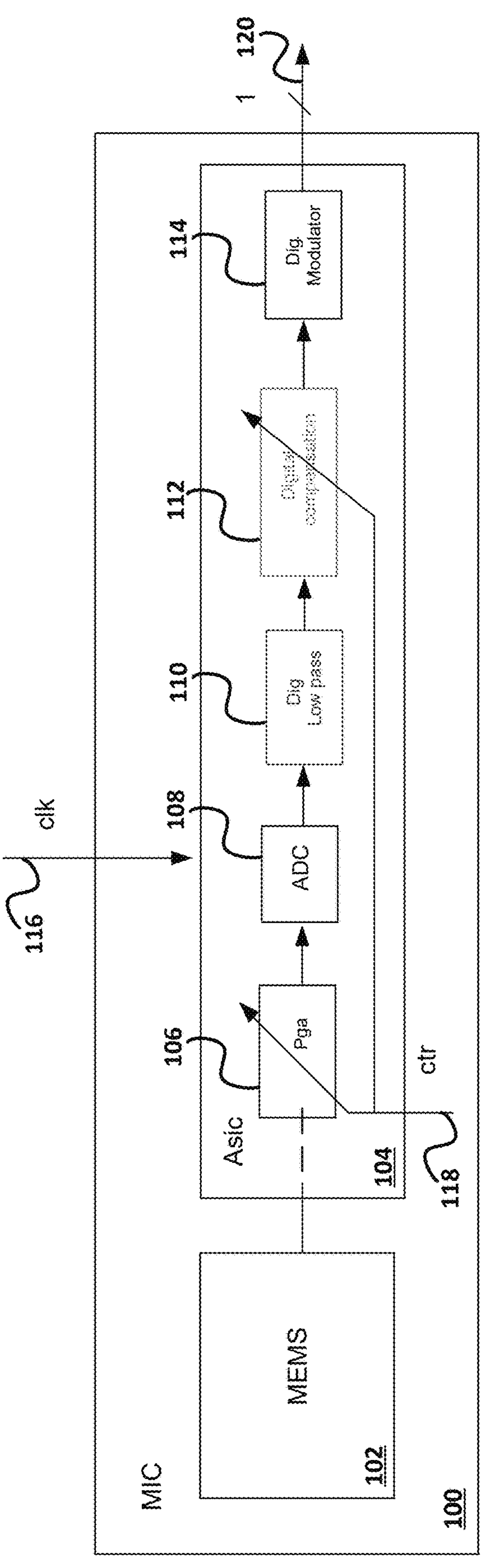
FIG. 1 is a block diagram of digital microphone including gain switching.
Figure 2A:
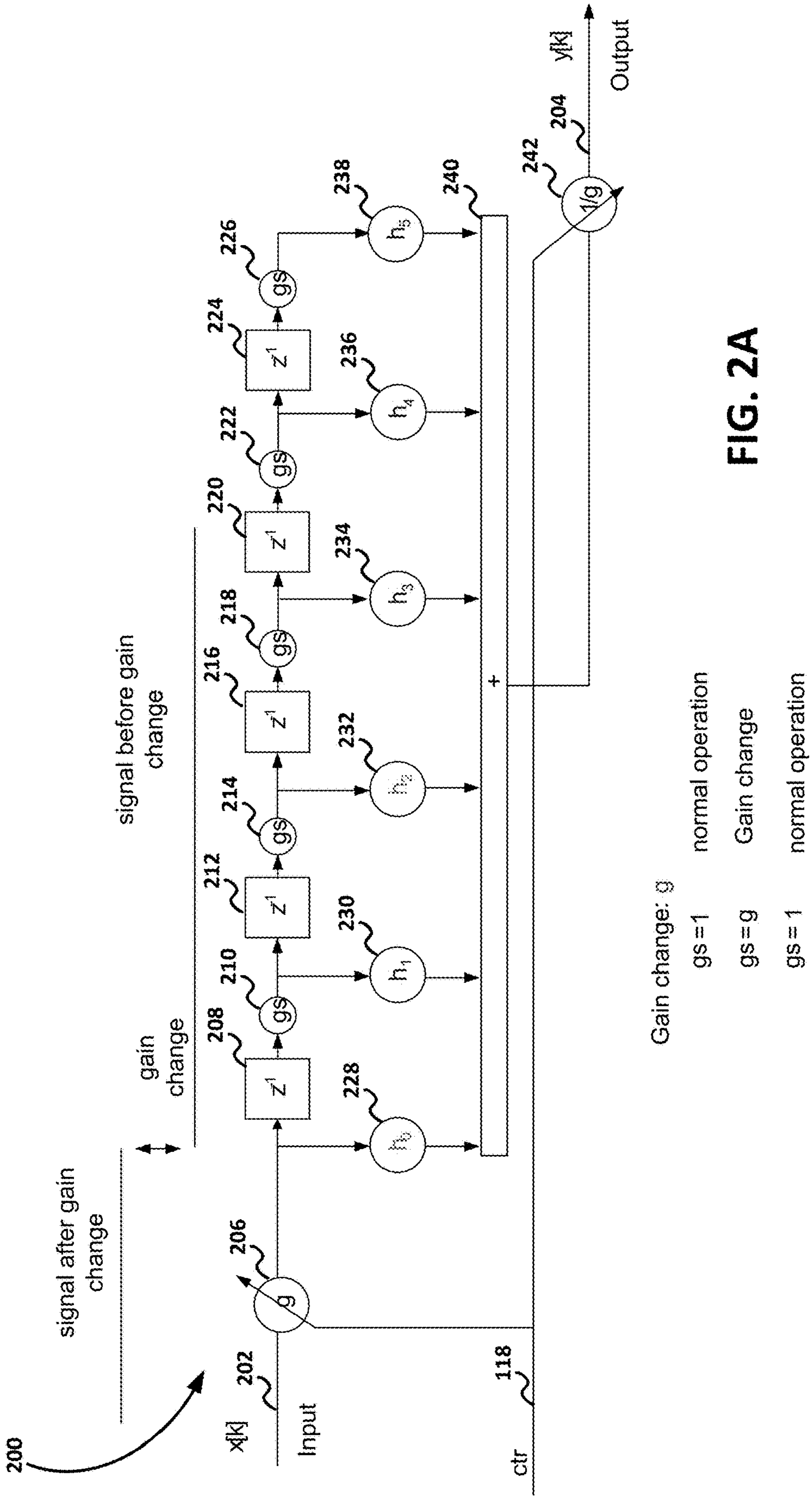
FIG. 2A is a schematic diagram of a digital finite impulse response (FIR) filter with transient reduction due to a memory update of a gain value, according to an embodiment.

FIG. 2A is a schematic diagram of a digital finite impulse response (FIR) filter 200 with transient reduction due to updating of gain component values, according to an embodiment. (Digital FIR filter 200 can correspond to the digital low pass filter 110 shown in FIG. 1, in an embodiment.) Digital FIR filter 200 comprises a delay line including one or more delay units 208, 212, 216, 220, and 224. While a fifth-order filter is shown in FIG. 2A, any number of delay units can be used to realize a different order filter. Each delay unit 208, 212, 216, 220, and 224 is shown in the inverse Z-transform notation that is implemented in the digital domain. Other types of delay units can also be used in some embodiments.

The delay line including one or more delay units 208, 212, 216, 220, and 224 is also serially coupled to one or more gain components 210, 214, 218, 222, and 226. Each gain component has a nominal value of one during a normal mode of operation, and a gain change value of "g" during a transient mode of operation. The gain change value of "g" can range from a value of three to five in some embodiments. Each gain component 210, 214, 218, 222, and 226 can be realized in a memory or lookup table (LUT) associated with digital FIR filter 200, or a digital microphone such as digital microphone 100 shown in FIG. 1.

The delay line including one or more delay units 208, 212, 216, 220, and 224 is also coupled to one or more filter coefficients $h_0$ 228, $h_1$ 230, $h_2$ 232, $h_3$ 234, $h_4$ 236, and $h_5$ 238. The one or more filter coefficients $h_0$ 228, $h_1$ 230, $h_2$ 232, $h_3$ 234, $h_4$ 236, and $h_5$ 238 are coupled to a summer 240. A gain component 206 with a gain of "g" is coupled between an input 202 of filter 200 and an input of delay unit 208 and filter coefficient $h_0$ 228. An inverse gain component 242 with a gain of "1/g" is coupled between an output of summer 240, and a filter output 204 of filter 200. Both gain component 206 and inverse gain component 242 are switched under the control of the "ctr" control signal 118. The control signal 118 is used to switch digital filter between a first constant digital microphone gain and a second constant digital microphone gain in the example of FIG. 2A. Both gain component 206 and inverse gain component 242 can be implemented as contents of a memory or as data in a lookup table (LUT).

According to embodiments, a "memory update" during the transient mode of operation for the purpose of minimizing audible transients between gain modes of a digital microphone is explained based on the digital FIR filter 200, which is represented in FIG. 2A. For simplicity reasons it is assumed that at the input of filter 200 a constant signal is applied and a step gain change "g" of the input signal occurs controlled by the signal "ctr" control signal. At the time of the switching event, the signal history of the digital signal in the delay line of the FIR filter is stored. The step at the input of the filter 200 is visible (for example in FIG. 7 and FIG. 8, which is described in detail below). This discontinuity generates an undesired audible transient signal. To avoid this jump, a memory update is applied to all of the delay units and the gain components in the filter 200. All of the delay units and the gain components are scaled by the gain change "g" when the switching event occurs (gs=g). In FIG. 2A, each gain component 210, 214, 218, 222, and 226 has a nominal value, and a value of "g" during the transient mode of operation as previously described. In FIG. 2A, the contents of all of the delay units 208, 212, 216, 220, 224 (nominal values) are multiplied by the gain change value "g" when the switching event occurs. The output y[k] of the filter 200 at filter output 204 is scaled by the inverse gain "1/g" as previously described. Generally, for each memory entry in the delay units a multiplier is needed to implement the memory update. However, the multiplier can be eliminated if specific gains are used (e.g. g=2, which can then be more simply implemented by a left shift).

In filter 200 of FIG. 2A, the delay line is implemented with gain components each coupled to an output of a corresponding delay unit. For example, the input of gain component 210 is coupled to an output of delay unit 208.

Figures 2B, 2C:
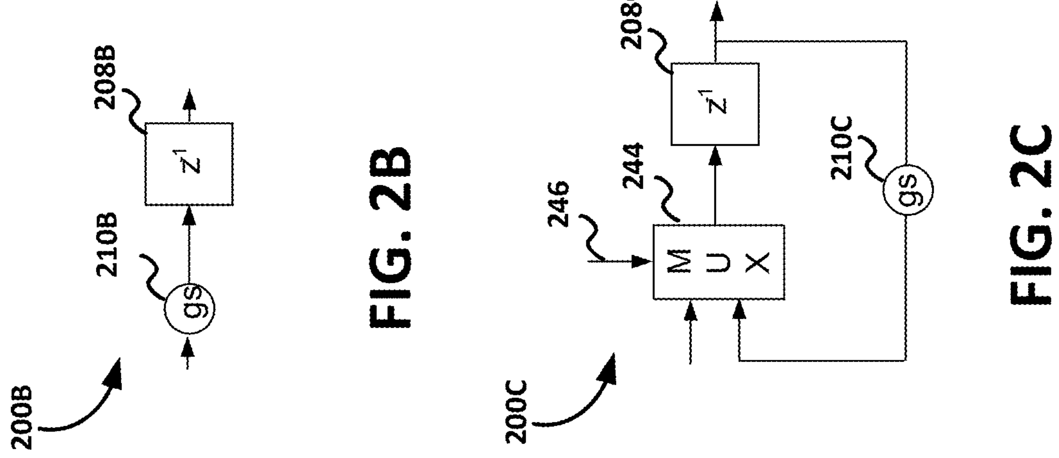
FIG. 2B is a schematic diagram of a portion of the digital FIR filter of FIG. 2A, according to an alternative embodiment.
FIG. 2C is a schematic diagram of a portion of the digital FIR filter of FIG. 2A, according to another alternative embodiment.

FIG. 2B is a schematic diagram of a portion 200B of the digital FIR filter 200 of FIG. 2A, according to an alternative embodiment, wherein the delay line is implemented with gain components each coupled to an input of a corresponding delay unit. For example, the output of gain component 210B is coupled to an input of a corresponding delay unit 208B. In the embodiment of FIG. 2B, the gain components labeled "gs" are enabled one cycle before the gain change of the gain components "g" and "1/g" are enabled.

FIG. 2C is a schematic diagram of a portion 200C of the digital FIR filter of FIG. 2A, according to another alternative embodiment, wherein the delay line is implemented with each of the gain components in a loop around a corresponding delay unit. For example, gain component 210C is in a loop between the output of delay unit 208C and an input of multiplexer 244. Delay unit 208C has an input coupled to the output of multiplexer 244. Multiplexer 244 includes a phase select signal input 246 for receiving a phase select control signal. In operation, the filter implemented with the embodiment of FIG. 2C comprises multiple phases within one data sample period. The multiple phases can include a phase for normal operation (standard filter operation) and a memory update phase wherein, in the case of a switching event, the register value is scaled by the value in a gain component such as gain component 210C. The different phases are controlled by the state of the phase select control signal.

Figure 3:
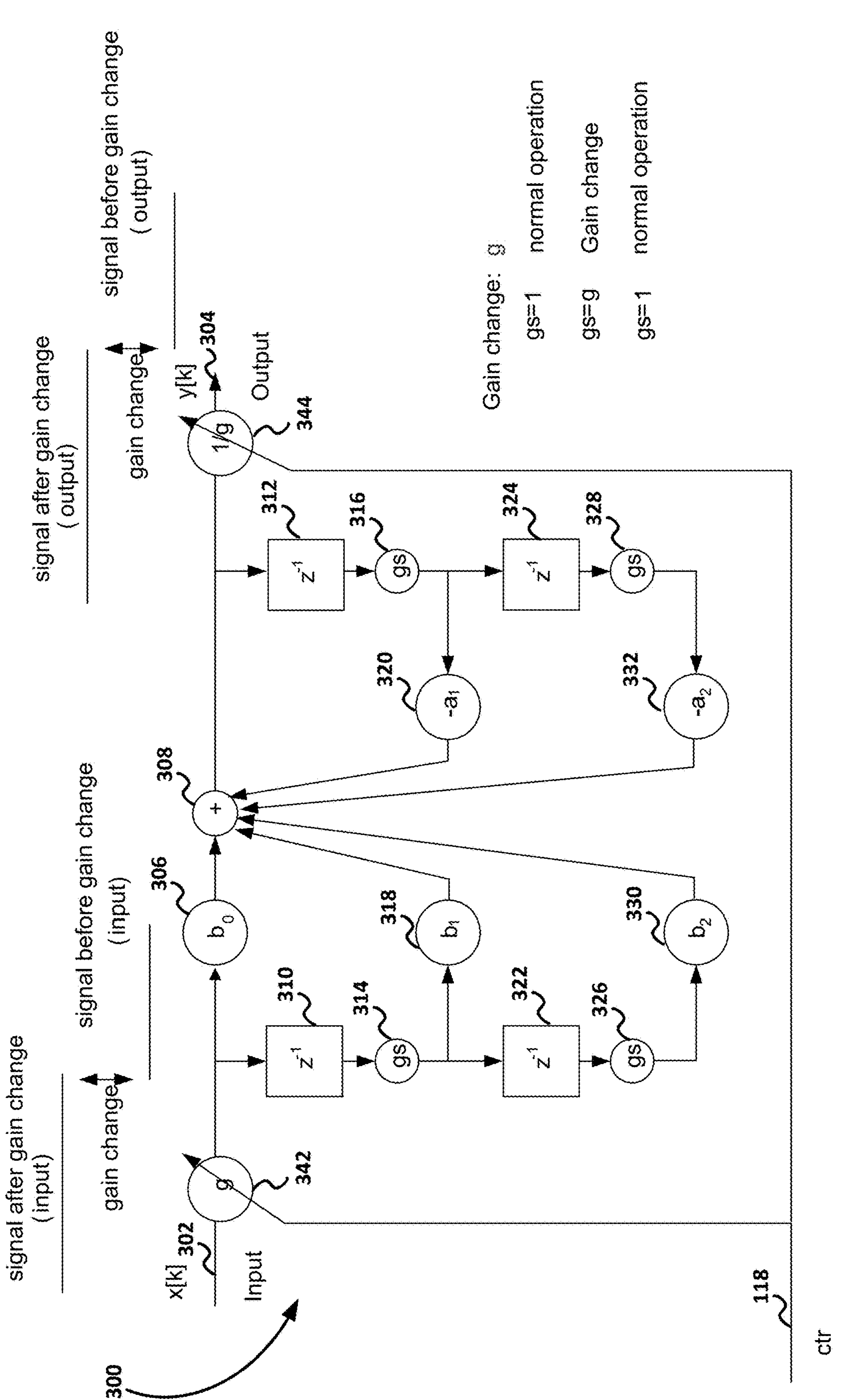
FIG. 3 is a schematic diagram of a digital infinite impulse response (IIR) filter (direct form, second order) with transient reduction due to a memory update of a gain value, according to an embodiment.

FIG. 3 is a digital IIR filter 300 (direct form, second order) with transient reduction due to a memory update, according to an embodiment. Digital IIR filter 300 includes a delay line including delay units 310, 312, 322, and 324. The delay units are coupled to one or more gain components having a gain value of "gs." The gain value of the gain components has been previously explained as having a nominal value of one during a normal mode of operation, and having a gain value of "g" during a transient mode of operation between two normal modes of operation. In a switching event, the contents of the delay units 310, 312, 322 and 324 are multiplied by the updated value of the gain components, which is "g".

The gain value of "g" can range between three and five in some embodiments. In digital IIR filter 300, the output of delay unit 310 is coupled to the input of gain component 314, the output of delay unit 312 is coupled to the input of gain component 316, the output of delay unit 322 is coupled to the input of gain component 326, and the output of delay unit 324 is coupled to the input of gain component 328. The delay line including the delay units and the gain components are in turn coupled to one or more filter coefficients $b_0$ 306, $b_1$ 318, $b_2$ 330, $-a_1$ 320, and $-a_2$ 332. The outputs of each of the filter coefficients $b_0$ 306, $b_1$ 318, $b_2$ 330, $-a_1$ 320, and $-a_2$ 332 are coupled to corresponding inputs of summer 308. Digital IIR filter 300 also includes a gain component 342 having a gain value of "g" and an inverse gain component 344 having a gain value of "1/g." Gain component 342 is coupled between filter input 302 and the inputs of filter coefficient $b_0$ 306 and delay unit 310. Inverse gain component 344 is coupled to the output of summer 308 and filter output 304. Gain component 342 and inverse gain component 344 are controlled by the "ctr" control signal 118 in an embodiment.

According to embodiment, the reduction of audible transients by updating the gain value can thus be extended to digital IIR filters. In FIG. 3 the reduction of audible transients is applied to a second order digital IIR filter 300 with direct form implementation (although any order filter can be used). As was demonstrated for the digital FIR filter 200, the gain component and delay unit values are updated and scaled by the gain change value "g" when the switching event occurs (gs=g).

Figure 4:
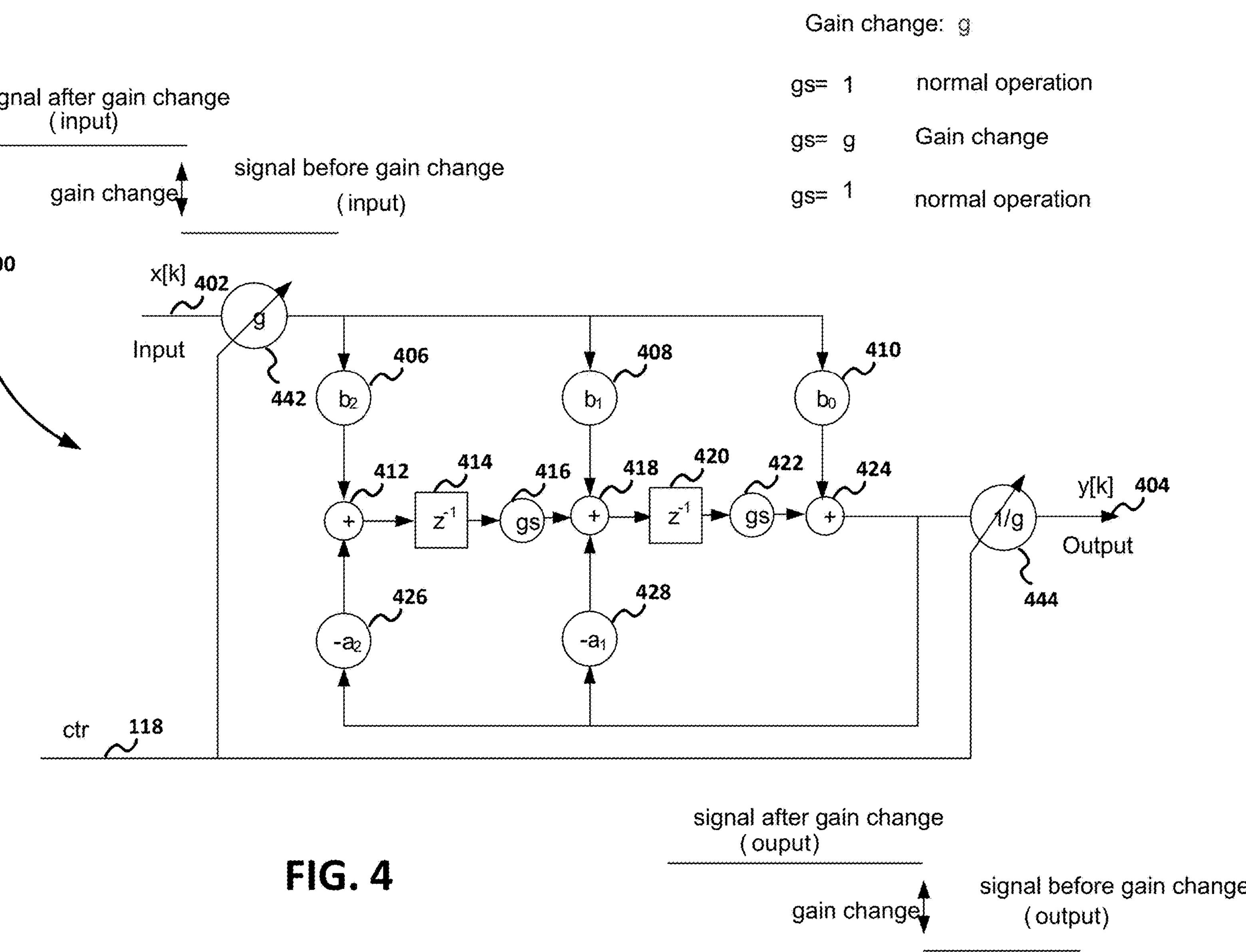
FIG. 4 is a schematic diagram of a digital IIR filter (canonical form, second order) with transient reduction due to a memory update of a gain value, according to an embodiment.

FIG. 4 is a digital IIR filter 400 (canonical form, second order) with transient reduction due to an update of gain values during a transient mode of operation, according to an embodiment. Digital IIR filter 400 includes a delay line including serially coupled delay units 414 and 420, as well as gain components 416 and 422. The delay units 414 and 420 are shown as an inverse Z-transform symbol, but also types of digital delay units can also be used. Gain components 416 and 422 have a nominal value of one during a normal mode of operation, and a value of "g" (which can be between three and five in some embodiments) during a transient mode of operation. Delay unit 414 and gain component 416 are coupled between summer 412 and summer 418. Delay unit 420 and gain component 422 are coupled between summer 418 and summer 424. Digital IIR filter 400 also includes one or more filter coefficients $b_2$ 406, $b_1$ 408, $b_0$ 410, $-a_2$ 426, and $-a_1$ 428. The output of filter coefficient 406 is coupled to an input of summer 412, the output of filter coefficient 408 is coupled to an input of summer 418, the output of filter coefficient 410 is coupled to an input of summer 424, the output of filter coefficient 426 is coupled to an input of summer 412, and the output of filter coefficient 428 is coupled to an input of summer 418. A gain component 442 having a value of "g" is coupled between filter input 402 and the inputs of filter coefficients 406, 408, and 410. An inverse gain component 444 is coupled between the outputs of filter coefficients 426 and 428, and the output of summer 424, and filter output 404. Gain component 442 and inverse gain component 444 are controlled by the "ctr" control signal 118.

In FIG. 4, according to an embodiment, audible transient reduction is applied to a second order IIR filter 400 with a canonical form implementation (standard form, with minimal realization). All gain values are updated and scaled by the gain change "g" when a switching event occurs (gs=g). The gain change from the nominal values to the gain change value of "g" are shown in the accompanying table of FIG. 4.

Generally the described embodiments of updating gain components with a new gain change value in the transient mode of operation works for any digital filter topology. For example, in FIGS. 5*a*, 5*b*, and 5*c* example CIC filters (used for decimation and interpolation) as are depicted having gain components suitable for updating during the transient mode of operation in order to minimize audible transients during gain switching of a digital microphone, or filter inside of the digital signal processing chain of a digital microphone.

Figure 5A:
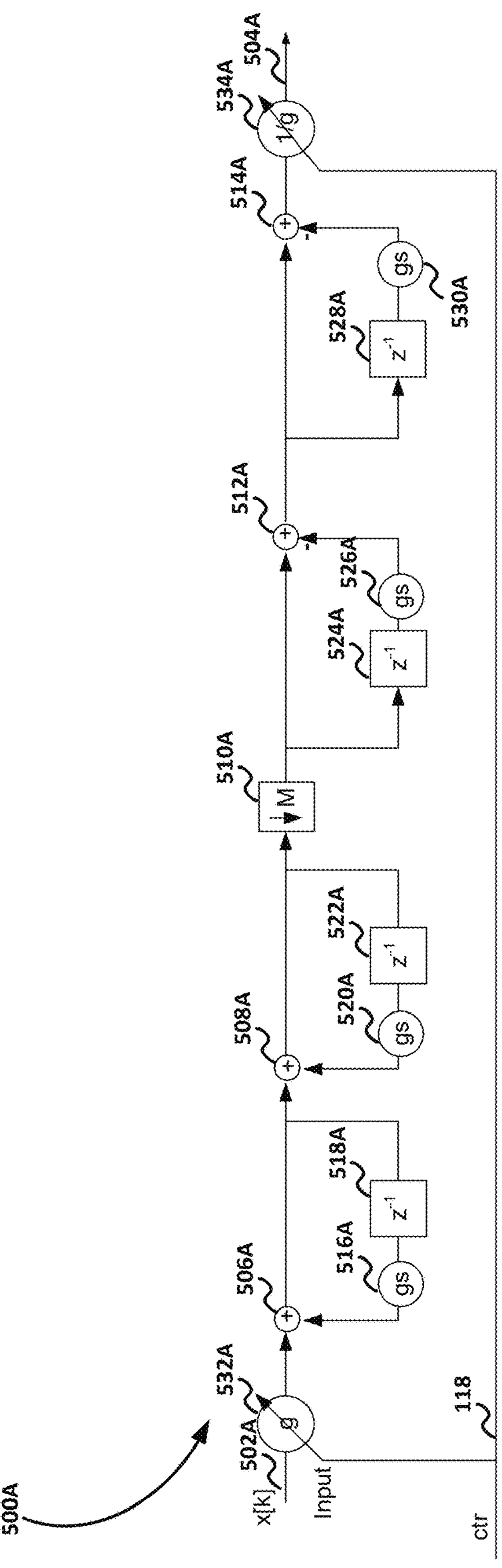
FIG. 5A is a schematic diagram of a cascaded integrator-comb (CIC) filter for decimation (second order, non-delaying) with transient reduction due to a memory update of a gain value, according to an embodiment.

FIG. 5A, for example, is a schematic diagram of a CIC filter 500A for decimation (second order, non-delaying) with transient reduction due to a gain value update, according to an embodiment. CIC filter 500A includes a delay unit 518A and a gain component 516A coupled between summer 506A and summer 508A (in a feedback path), and a delay unit 522A and a gain component 520A coupled between summer 508A and decimation component 510A (in a feedback path). CIC filter 500A further includes a delay unit 524A and a gain component 526A coupled between decimation component 510A and summer 512A (in a feedforward path), and a delay unit 528A and a gain component 530A coupled between summer 512A and summer 514A (in a feedforward path).

Gain components have a gain value set to a nominal value of one during a normal mode of operation and gain value (gs=g) set to a gain value of "g" (typically between three and five in an embodiment) during a transient mode of operation for the purpose of reducing or eliminating audio transients during or immediately after a gain switching event of a digital microphone. In addition, the contents of the delay units are multiplied by the gain value during the transient mode of operation.

CIC filter 500A also includes a gain component 532A and an inverse gain component 534A of the type previous described correspondingly coupled to filter input 502A and filter output 504A, and under the control of the "ctr" control signal 118.

Figure 5B:
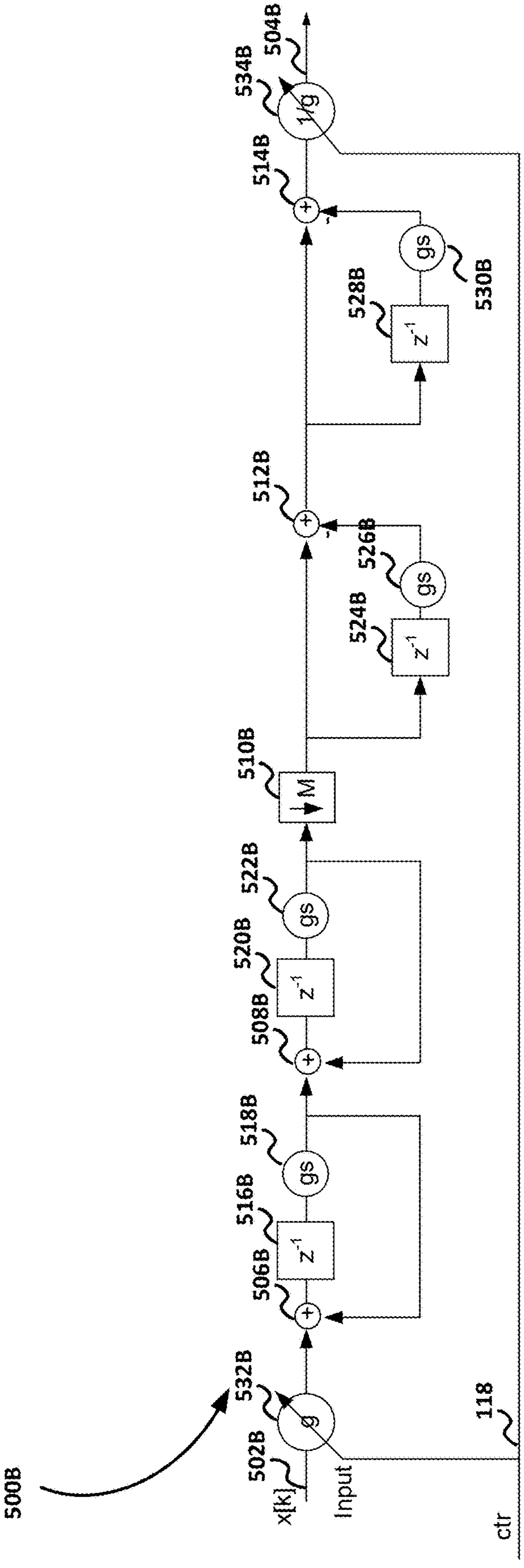
FIG. 5B is a schematic diagram of a CIC filter for decimation (second order, delaying) with transient reduction due to a memory update of a gain value, according to an embodiment.

FIG. 5B is a CIC filter 500B for decimation (second order, delaying) with transient reduction due to a memory update, according to another embodiment. CIC filter 500B comprises a time delay unit 516B and a gain component 518B coupled between summer 506B and summer 508B with a unity feedback path between summer 506B and summer 508B, a time delay unit 520B and a gain component 522B coupled between summer 508B and decimation component 510B with a unity feedback path between decimation component 510B and summer 508B. CIC filter 500B also comprises a time delay unit 524B and a gain component 526B coupled between decimation component 510B and summer 512B with a unity feedforward path between decimation component 510B and summer 512B, and a time delay unit 528B and a gain component 530B coupled between summer 512B and summer 514B with a unity feedforward path between summer 512B and summer 514B. CIC filter 500B also includes a gain component 532 coupled to filter input 502B and an inverse gain component 534B coupled to filter output 504B under the control of the "ctr" signal 118, as previously described with respect to other filter implementations according to embodiments.

Figure 5C:
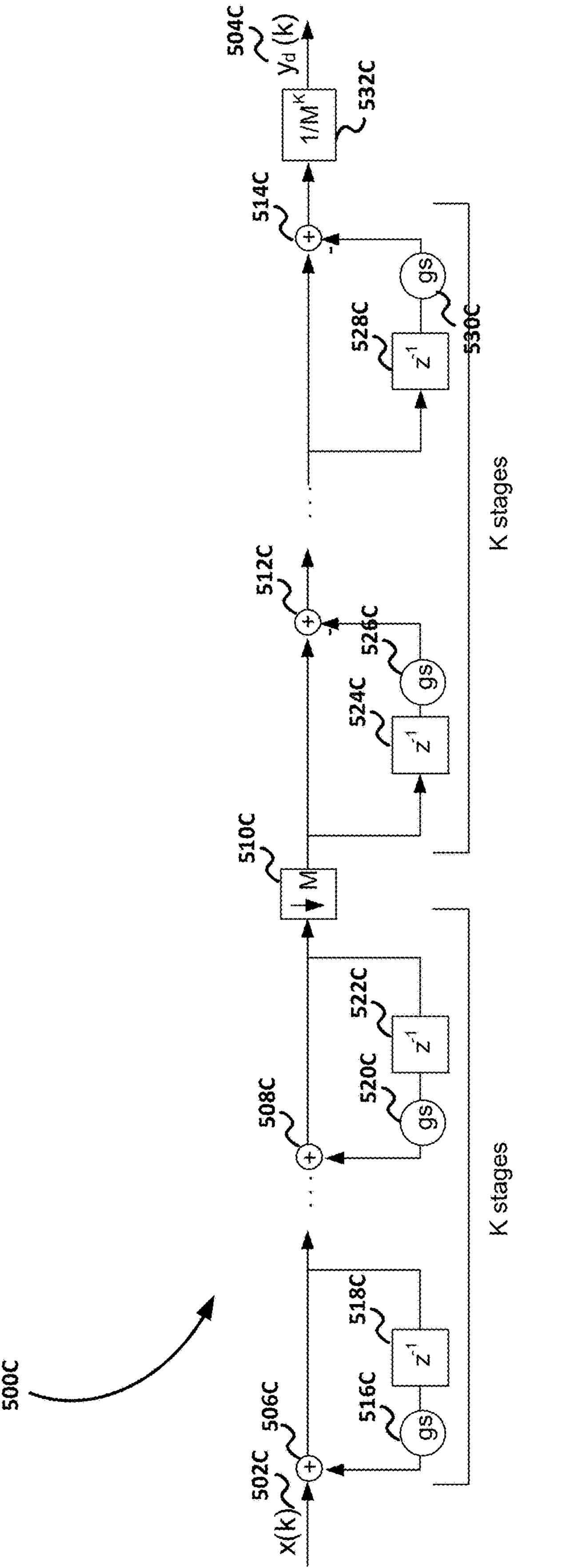
FIG. 5C is a schematic diagram of a CIC filter for decimation (Kth order, non-delaying) with transient reduction due to a memory update of a gain value, according to an embodiment.

FIG. 5C is a CIC filter 500C for decimation (Kth order, non-delaying) with transient reduction due to memory update, according to an embodiment. CIC filter 500C includes "K" stages coupled between a filter input 502C and a decimation component 510C. For example, the first stage includes a summer 506C, a gain component 516C, and a delay unit 518C. The Kth stage includes a summer 508C, a gain component 520C, and a delay unit 522C. The first stage of the second group of K stages includes a summer 512C, a delay unit 524C and a gain component 526C. The Kth stage of the second group of K stages includes a summer 514C, a delay unit 528C, and a gain component 530C. CIC filter 500C also includes an inverse gain stage 532C as shown.

Figure 6A:
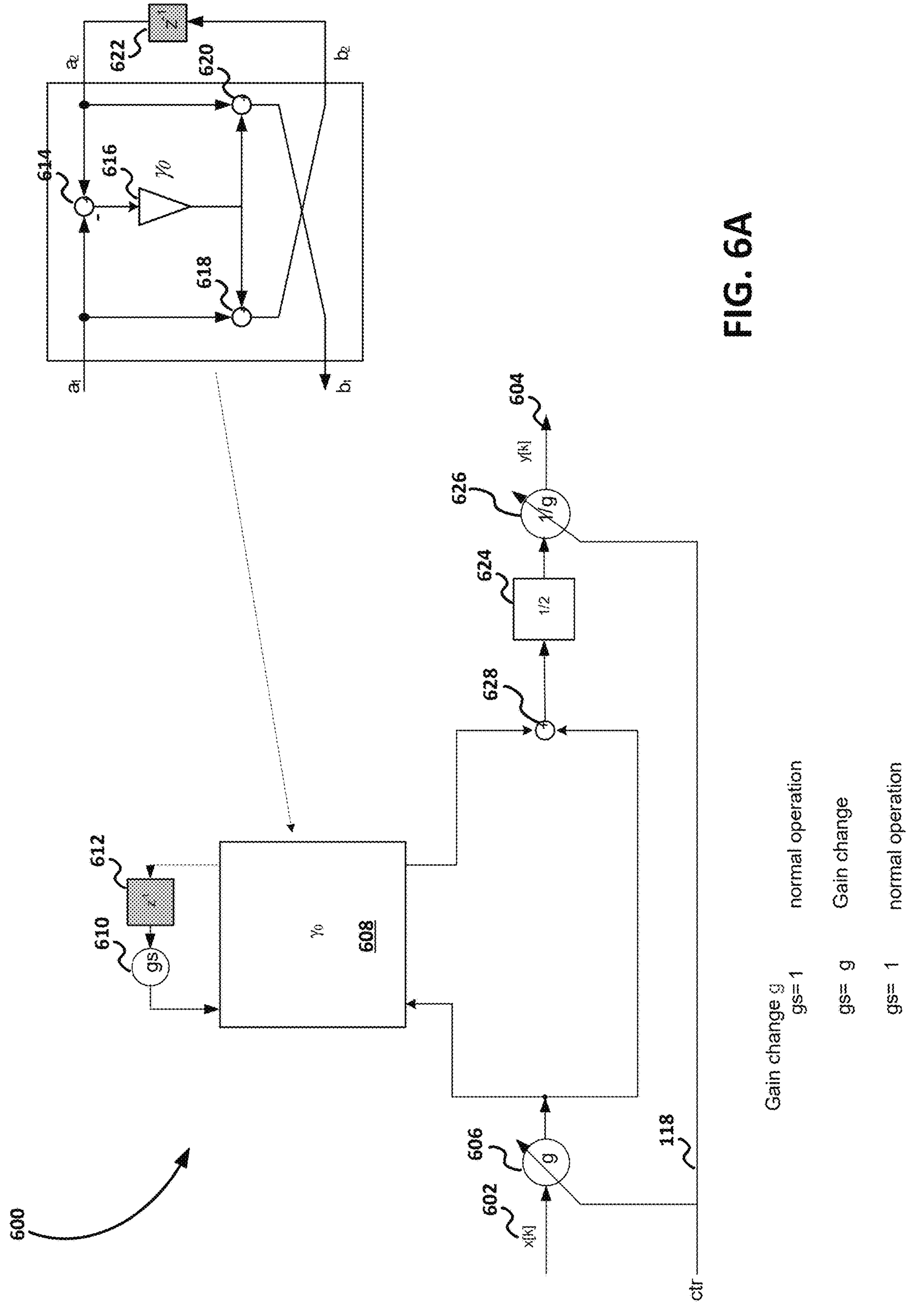
FIG. 6A is a schematic diagram of a wave digital filter (WDF) (low-pass, first order) with transient reduction due to a memory update of a gain value, according to an embodiment.
Figure 6B:
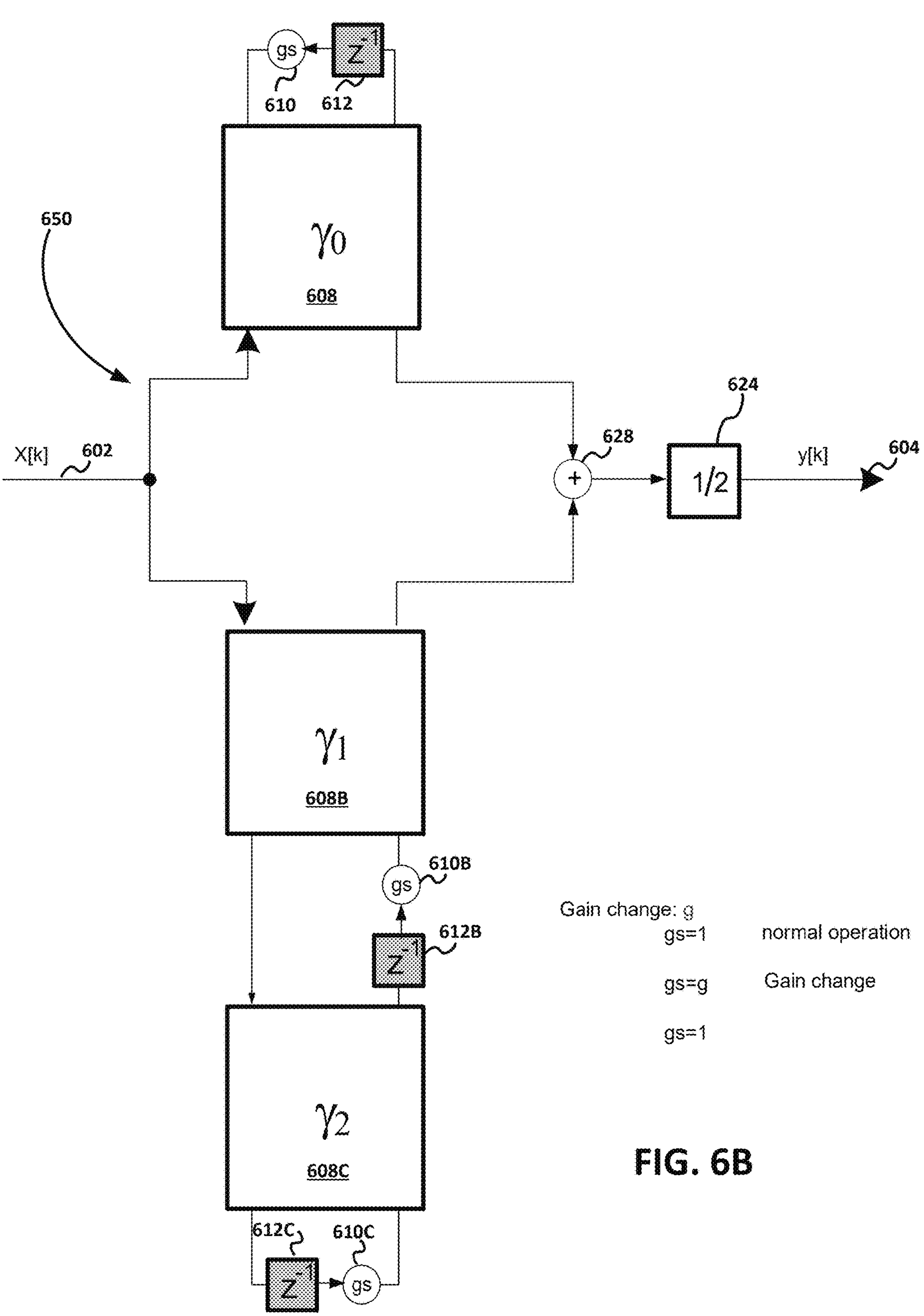
FIG. 6B is a schematic diagram of a WDF filter (low-pass, third order) with transient reduction due to a memory update of a gain value, according to an embodiment.

The examples of wave digital filters (WDF) are shown in FIG. 6*a* and FIG. 6*b*, which also implement transient reduction, according to embodiments, due to a gain component and delay unit update. While a first order and a third order WDF filter are shown and described below, it will be apparent to those skilled in the art that any order WDF filter can be used to implement transient reduction due to updating of gain component and delay unit contents. In the WDF filters shown in FIG. 6A and FIG. 6*b*, the memory update is accomplished generally within one clock cycle. In other words, the transient mode of operation lasts for only a single clock cycle.

FIG. 6A is a schematic diagram of a digital WDF filter 600 (low-pass, first order) with transient reduction due to memory update, according to an embodiment. WDF filter 600 includes an adapter block 608 coupled to a gain component 610 in series connection with a delay unit 612 (shown as an inverse Z-transform symbol) at nodes $a_1$ and $a_2$. Adapter block 608 includes a summer 614 having inputs coupled between nodes $a_1$ and $a_2$, as well as summers 618 and 620 having inputs coupled between nodes $a_1$ and $a_2$. An all-pass component 616 has a gamma value ($\gamma_0$), which is between −1 and +1, and has an input coupled to the output of summer 614 and an output coupled to an input of summer 618 and an input of summer 620. The output of summer 620 is coupled to node $b_1$, and the output of summer 618 is coupled to node $b_2$.

WDF filter 600 further includes a gain component 606 coupled between filter input 602 and node $b_1$, and a summer having an input coupled to node $b_2$ and an output coupled to an input of gain component 624. Gain component 624 has a gain of ½, in an embodiment. An inverse gain component 626 is coupled between an output of gain component 624 and filter output 604. Gain component 624 and inverse gain component 626 are controlled by the "ctr" control signal 118. The output of gain component 606 is also directly coupled to an input of summer 628.

During the normal mode of operation, the gain value of gain component 610 has a nominal value of one. During the transient mode operation, which lasts for a single clock cycle, the gain value is equal to a value of "g", which can between a value of three and five in some embodiments (gs=g). Other gain values can also be used in some embodiments.

FIG. 6B is a digital WDF filter 650 (low-pass, 3rd order) with transient reduction due to memory update, according to an embodiment. WDF filter 650 includes a first adapter block 608 including a gain component 610 and a delay unit 612, a second adapter block 608B including a gain component 610B and a delay unit 612B, and a third adapter block 608C including a gain component 610C and a delay unit 612C. In operation, all of the gain components have a nominal value of one during normal modes of operation, and a value of "g" during the transient mode of operation, and the contents of the delay units are similarly updated, so that an audible transients in the digital processing chain of a digital microphone are reduced or even eliminated according to embodiments.

Figure 7:
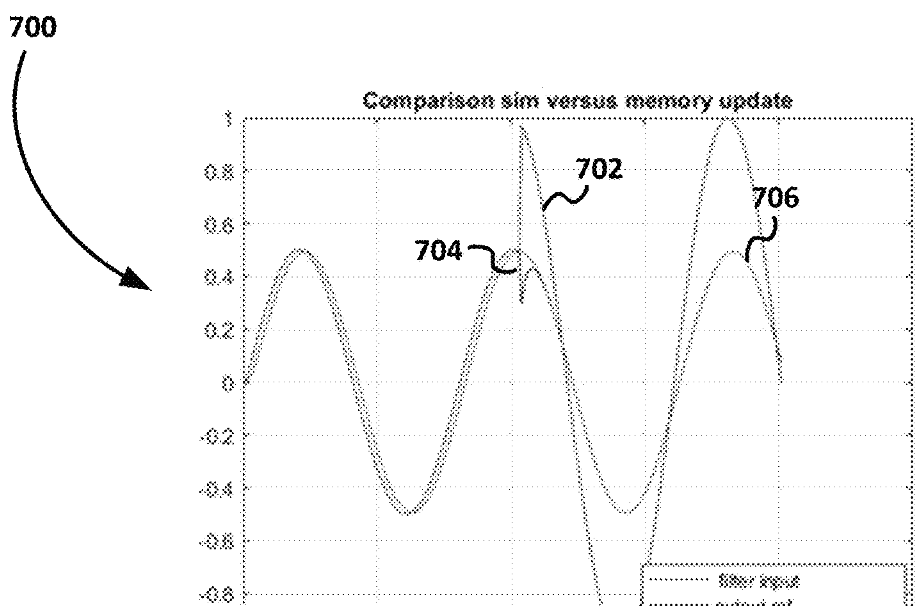
FIG. 7 is a graphical comparison of time domain signals of a first order WDF filter with and without a memory update according to an embodiment.

FIG. 7 is a graphical comparison 700 of simulated time domain signals of a first order WDF filter with and without a gain component update feature according to an embodiment. A step change of the input signal 702 can be seen in response to a request for a gain change in the digital processing chain of a digital microphone, wherein the digital processing chain includes the first order WDF filter. The digital filter output 704 without the gain component update feature clearly shows an undesired audible transient in response to the request for a gain change of the digital microphone. In comparison, the digital filter output 706 with the gain component update feature according to embodiments shows no audible transient in response to the request for a gain change of the digital microphone.

Figure 8:
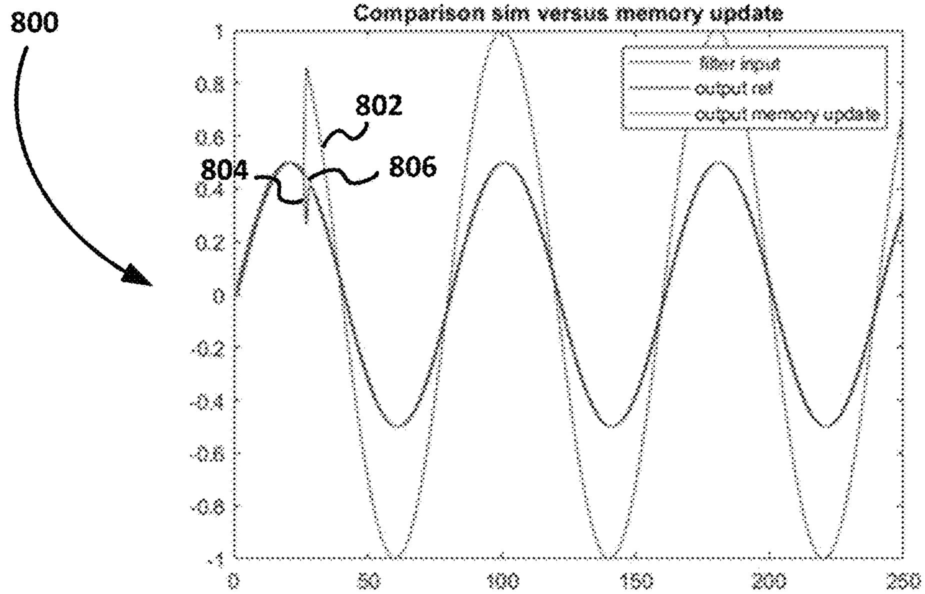
FIG. 8 is a graphical comparison of time domain signals of a second order CIC filter with and without a memory update according to an embodiment.

FIG. 8 is a graphical comparison 800 of simulated time domain signals of a second order CIC filter with and without a gain component update feature according to an embodiment. A step change of the input signal 802 can be seen in response to a request for a gain change in the digital processing chain of a digital microphone, wherein the digital processing chain includes the second order CIC filter. The digital filter output 804 without the gain component update feature clearly shows an undesired audible transient in response to the request for a gain change of the digital microphone. In comparison, the digital filter output 806 with the gain component update feature according to embodiments shows no audible transient in response to the request for a gain change of the digital microphone.

Figure 9:
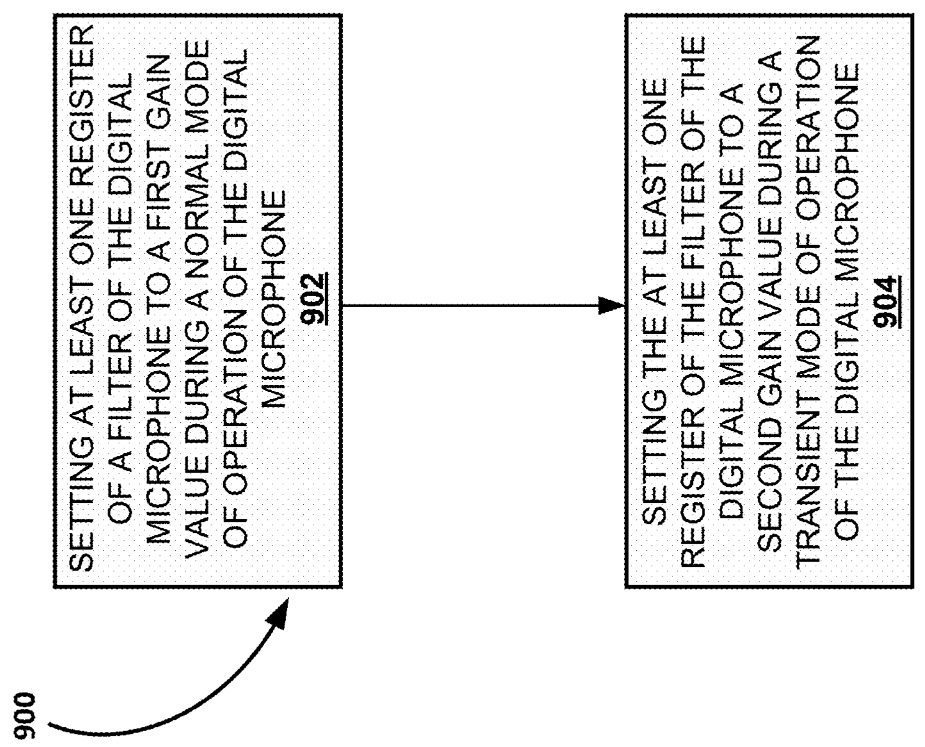
FIG. 9 is a block diagram of a method of operating a digital microphone with transient reduction due to a memory update of a filter gain value, according to an embodiment.

FIG. 9 is a block diagram 900 of a method of operating a digital microphone, according to an embodiment. A method of operating a digital microphone comprises setting at least one gain component of a filter of the digital microphone to a first gain value during a normal mode of operation of the digital microphone at step 902; and setting the at least one gain component of the filter of the digital microphone to a second gain value during a transient mode of operation of the digital microphone at step 904.

While embodiments of the present invention have been described with respect to specific examples, it will be apparent to those skilled in the art that embodiment principles of the invention can be expanded to other types of digital filters not specifically described herein, to other types of digital signal processing chains used in other types of digital microphones, and to other gain ranges for the gain values of the gain components described herein. In some embodiments additional delay units might be used so that internal control signals may be delayed with respect to the gain change signal received by the digital microphone.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital microphone comprising:

a programmable gain amplifier (PGA);

an analog-to-digital converter (ADC) coupled to the PGA;

a digital filter coupled to the ADC, wherein the digital filter comprises at least one gain component; and a digital gain compensation component coupled between an output of a first delay unit and an input of a second delay unit of the digital filter, wherein the at least one gain component comprises a first value during a normal mode of operation of the digital microphone, wherein the at least one gain component comprises a second value during a transient mode of operation of the digital microphone, and wherein the digital filter further comprises:

a delay line including at least the first delay unit and the second delay unit;

at least one gain component coupled to the delay line; and a summer coupled to the delay line.

2. The digital microphone of claim 1, wherein at least the second value comprises a gain value stored in a memory.

3. The digital microphone of claim 1, wherein the delay line includes at least a third delay unit.

4. The digital microphone of claim 1, wherein the normal mode of operation comprises a first portion corresponding to a first gain value of an input signal of the filter, and wherein the normal mode of operation comprises a second portion corresponding to a second gain value of the input signal of the filter.

5. The digital microphone of claim 4, wherein the transient mode of operation is interposed between the first portion of the normal mode of operation and the second portion of the normal mode of operation.

6. The digital microphone of claim 1, wherein a length of the transient mode of operation comprises a single clock cycle.

7. The digital microphone of claim 1, wherein the filter comprises a finite impulse response (FIR) filter.

8. The digital microphone of claim 1, wherein the filter comprises an infinite impulse response (IIR) filter.

9. The digital microphone of claim 1, wherein the filter comprises a cascaded integrator comb (CIC) filter.

10. The digital microphone of claim 1, wherein the filter comprises a wave digital filter (WDF).

11. A digital microphone comprising:

a programmable gain amplifier (PGA);

an analog-to-digital converter (ADC) coupled to the PGA;

a digital filter coupled to the ADC, wherein the digital filter comprises at least one gain component; and a digital gain compensation component coupled between an output of a first delay unit and an input of a second delay unit of the digital filter, wherein the at least one gain component comprises a first value during a normal mode of operation of the digital microphone, and wherein the at least one gain component comprises a second value during a transient mode of operation of the digital microphone.

12. The digital microphone of claim 11, wherein the at least one gain component comprises a gain value stored in a memory.

13. The digital microphone of claim 11, further comprising a third delay unit.

14. The digital microphone of claim 11, wherein the normal mode of operation comprises a first portion corresponding to a first gain value of the digital microphone, and wherein the normal mode of operation comprises a second portion corresponding to a second gain value of the digital microphone.

15. The digital microphone of claim 14, wherein the transient mode of operation is interposed between the first portion of the normal mode of operation and the second portion of the normal mode of operation.

16. A method of operating a digital microphone, the method comprising:

setting at least one gain component coupled between an output of a first delay unit and an input of a second delay unit of a filter of the digital microphone to a first gain value during a normal mode of operation of the digital microphone; and setting the at least one gain component of the filter of the digital microphone to a second gain value during a transient mode of operation of the digital microphone.

17. The method of claim 16, further comprising storing at least the second gain value in a memory.

18. The method of claim 17, further comprising updating the memory during the transient mode of operation.

19. The method of claim 16, further comprising setting a length of the transient mode of operation to a single clock cycle of the digital microphone.

20. The method of claim 16, further comprising initiating the transient mode of operation in response to a change of gain command to the digital microphone.

* * * * *